US010862259B2

(12) United States Patent
Schmidt et al.

(10) Patent No.: US 10,862,259 B2
(45) Date of Patent: Dec. 8, 2020

(54) METHOD FOR MANUFACTURING AT LEAST ONE FUNCTIONAL AREA ON AN ELECTRIC CONTACT ELEMENT SUCH AS A SWITCHING CONTACT OR A PLUG CONTACT

(71) Applicant: TE CONNECTIVITY GERMANY GMBH, Bensheim (DE)

(72) Inventors: Helge Schmidt, Speyer (DE); Michael Leidner, Lambrecht (DE); Soenke Sachs, Frankfurt am Main (DE)

(73) Assignee: TE CONNECTIVITY GERMANY GMBH, Bensheim (DE)

( * ) Notice: Subject to any disclaimer, the term of this patent is extended or adjusted under 35 U.S.C. 154(b) by 6 days.

(21) Appl. No.: 15/593,468

(22) Filed: May 12, 2017

(65) Prior Publication Data

US 2017/0250513 A1    Aug. 31, 2017

Related U.S. Application Data

(62) Division of application No. 14/009,845, filed as application No. PCT/EP2012/055936 on Apr. 2, 2012, now Pat. No. 9,667,015.

(30) Foreign Application Priority Data

Apr. 6, 2011   (DE) .................. 10 2011 006 899

(51) Int. Cl.
*C23C 24/10*      (2006.01)
*H01H 11/04*     (2006.01)
*H01R 43/16*     (2006.01)
*H05K 3/24*       (2006.01)
*H01R 13/03*     (2006.01)

(52) U.S. Cl.
CPC ............ *H01R 43/16* (2013.01); *C23C 24/106* (2013.01); *H01H 11/04* (2013.01); *H01H 11/041* (2013.01); *H01R 13/03* (2013.01); *H05K 3/247* (2013.01)

(58) Field of Classification Search
CPC ........ H01R 43/16; H01R 13/03; H01H 11/04; H01H 11/041; C23C 24/106; H05K 3/247
USPC .................. 427/552, 555, 556, 557, 558
See application file for complete search history.

(56) References Cited

U.S. PATENT DOCUMENTS

| | | | |
|---|---|---|---|
| 3,682,729 A | 8/1972 | Gukelberger | |
| 5,254,185 A * | 10/1993 | Schade | H01H 11/041 118/320 |
| 5,679,471 A | 10/1997 | Cheng | |
| 5,707,749 A | 1/1998 | Katagiri | |
| 5,837,960 A * | 11/1998 | Lewis | B23K 26/34 219/121.63 |
| 5,972,131 A | 10/1999 | Asada | |
| 6,045,892 A | 4/2000 | Lee | |
| 7,029,760 B2 | 4/2006 | Mori | |
| 7,071,563 B2 | 7/2006 | Bhowmik | |
| 7,314,268 B2 | 1/2008 | Aruga | |
| 7,569,331 B2 | 8/2009 | Dorogy | |
| 2001/0030174 A1 * | 10/2001 | Watanabe | H01H 33/6645 218/118 |
| 2005/0100720 A1 | 5/2005 | Shirai | |
| 2006/0108334 A1 * | 5/2006 | Frietsch | H01H 11/041 219/121.64 |
| 2007/0269648 A1 | 11/2007 | Schuh | |
| 2007/0281099 A1 * | 12/2007 | Howarth | H05K 3/125 427/402 |
| 2009/0032593 A1 | 2/2009 | Ljungcrantz | |
| 2009/0104435 A1 | 4/2009 | Hutchison | |
| 2010/0304177 A1 | 12/2010 | Yoshida | |
| 2011/0236712 A1 * | 9/2011 | Masago | C23C 28/021 428/600 |

FOREIGN PATENT DOCUMENTS

| | | |
|---|---|---|
| CN | 1368562 | 9/2002 |
| CN | 1519991 | 8/2004 |
| CN | 1591989 | 3/2005 |
| CN | 101681728 | 3/2010 |

(Continued)

OTHER PUBLICATIONS

International Search Report issued by the European Patent Office, dated Aug. 13, 2012, for related International Application No. PCT/EP2012/055936; 5 pages.
Written Opinion of the International Searching Authority issued by the European Patent Office, dated Aug. 13, 2012, for related International Application No. PCT/EP2012/055936; 8 pages.
International Preliminary Report on Patentability issued by the International Bureau of WIPO, dated Oct. 8, 2013, for related International Application No. PCT/EP2012/055936; 9 pages.

(Continued)

*Primary Examiner* — Jose I Hernandez-Kenney
(74) *Attorney, Agent, or Firm* — Faegre Drinker Biddle & Reath LLP

(57) ABSTRACT

The invention relates to a method for producing at least one functional region on an electrical contact element such as, for example, a switching contact or a plug type contact. In order to prevent the high environmental burden which is disadvantageous in wet-chemical methods and to overcome the restriction to a very small number of materials caused in hot dip methods in physical technical terms, and to substantially improve the spatial possibility for selection and structuring which is insufficient in both techniques, there is provision according to the invention for at least one material coating to be applied mechanically in a highly selective manner to the contact element in the functional region and subsequently highly energetic thermal radiation such as, for example, a particle beam in the form of an ion and/or electron beam, to be directed onto the at least on material coating.

6 Claims, 10 Drawing Sheets

(56) References Cited

FOREIGN PATENT DOCUMENTS

| | | |
|---|---|---|
| DE | 3005662 | 8/1981 |
| DE | 3541584 | 5/1987 |
| DE | 102009024962 | 12/2010 |
| EP | 0182182 | 5/1986 |
| JP | 2005032783 | 2/2005 |
| JP | 2010161015 | 7/2010 |

OTHER PUBLICATIONS

English translation of the Examination Report issued by the State Intellectual Property Office of the People's Republic of China, dated Aug. 5, 2015, for Chinese Patent Application No. 201280019943.8; 15 pages.

* cited by examiner

METHOD FOR MANUFACTURING AT LEAST ONE FUNCTIONAL AREA ON AN ELECTRIC CONTACT ELEMENT SUCH AS A SWITCHING CONTACT OR A PLUG CONTACT

CROSS REFERENCE TO RELATED APPLICATIONS

The present application is a divisional of U.S. patent application Ser. No. 14/009,845, filed Oct. 4, 2013, titled "METHOD FOR MANUFACTURING AT LEAST ONE FUNCTIONAL AREA ON AN ELECTRIC CONTACT ELEMENT SUCH AS A SWITCHING CONTACT OR A PLUG CONTACT", which is a U.S. 371 National Stage application of International Application No. PCT/2012/055936, filed Apr. 2, 2012, titled "METHOD FOR MANUFACTURING AT LEAST ONE FUNCTIONAL AREA ON AN ELECTRIC CONTACT ELEMENT SUCH AS A SWITCHING CONTACT OR A PLUG CONTACT", which claims priority from German Patent Application No. 102011006899.6, filed Apr. 6, 2011, the entire disclosures of which are expressly incorporated by reference herein.

BACKGROUND OF THE INVENTION

The invention relates to a method for producing at least one functional region on an electrical contact element, the at least one functional region being limited to a partial area of the contact element. The invention further relates to a contact element which is produced by such a method and a device for producing such a contact element.

Such contact elements may be contacts for plug type connectors or switching contacts. The functional regions are surface regions of the contact element which perform a particular function during operation when the contact element is assembled in the electrical component. Functional regions are, for example, contact locations at which a counter-contact mechanically and electrically contacts the contact element, introduction regions along which counter-contacts move over the surface of the contact element, for example, when plug type connectors are fitted together, regions in which the contact element is in contact with other components and which are at risk of corrosion, and connection locations for crimpling, soldering or other connections.

The contact elements are generally produced from copper or a copper alloy. They are generally coated by means of electroplating methods, mainly with a belt type conveying system. Plating type coating of the contact elements with metals such as gold, silver, palladium, nickel and tin and with alloys based on or containing those metals is particularly known.

Tin contacts can also be produced by means of a hot dip tin-plating method.

SUMMARY OF THE INVENTION

In both methods, the selection of the materials with which the contact elements can be coated is limited. Alloys further cannot be precipitated freely in the electroplating methods. In hot dip coating with tin, the process is limited by the process temperature of the melt. In both methods, it is subsequently impossible, or possible only with great difficulty, to change the coating properties.

The production of a plurality of different functional regions which are optimised with regard to their function on one contact element is not possible.

Hot dip tin-plating involves another disadvantage in that selective coating of regions which are limited in terms of surface-area is scarcely possible.

Although limited coating faces in the order of magnitude of a few millimetres can be produced by selective technologies in electroplating methods, it is not currently possible technically to produce relatively small regions by means of selective electroplating. This order of magnitude is overdimensioned for the functional regions necessary for contact elements.

In contact elements from switching technology, the contact locations, for example, the contact rivets, are produced separately and subsequently joined to the contact elements. The contact locations can be processed metallurgically. Owing to the tolerances in the production of the contact rivets and the fitting operation, inaccuracies which may result in substantial rejects occur.

In view of the disadvantages of the known methods described above, the problem addressed by the invention is to provide a method which allows simple and precise production of functional regions in contact elements and which, at the same time, has the potential for producing on one contact element a plurality of functional regions which can be optimised for their function, respectively.

This problem is solved for the method mentioned in the introduction in that at least one material coating is mechanically applied to the contact element in the functional region and a highly energetic thermal radiation is subsequently directed onto the at least one material coating.

The mechanical application of the material coating avoids the disadvantages of the electroplating methods and hot dip methods, such as, for example, hot dip tin-plating. Only the material which is necessary for the function of the functional region has to be applied at the location at which the functional region is necessary. The subsequent irradiation allows selective and controlled changing of the mechanical or chemical properties of the material coating applied.

The mechanical application of the material coating avoids the cost-intensive environmental regulations of the wet-chemical methods. During the mechanical application, less of the expensive material also has to be held in the form of large melt baths or plating baths. This has a particular effect in material coatings which contain precious metals.

In particular, irradiation with electrons or ions and other atomic or subatomic particles is considered below to be a highly energetic thermal radiation. Laser beams and X-ray beams may also be considered to be highly energetic thermal radiation.

The solution according to the invention can be developed by means of the following features which are independent of each other, are advantageous per se and can be freely combined with each other.

According to a particularly advantageous construction, there is thus provision for the at least one material coating to be printed on. In this instance, printing techniques such as, for example, screen printing, inkjet printing, gravure printing, stamp printing or printing directly or indirectly via intermediate carriers, for example, intermediate rollers, may be used. Printing of the functionally relevant material coating is preferably carried out directly on the base material of the contact element. However, the contact element may also be precoated with other methods.

Owing to the mechanical application in one of the above configurations, in particular a plurality of different material coatings can be arranged one above the other and/or beside each other. The higher the resolution of the application method, the more precisely the material coatings can be positioned relative to each other.

The individual material coatings which are applied one above the other and/or beside each other on the contact element may comprise different materials. For example, material coatings which are located in the lower portion nearer the base material of the contact element can act as corrosion protection and/or a diffusion barrier in order to isolate upper coatings chemically with respect to the lower coating.

Substances which evaporate during irradiation or after an upstream drying step and which simply act as a transport medium for the above-mentioned basic or additional components can be contained in the mechanically applied material which forms the material coating.

After the mechanical application, the material coating is heated according to the invention by the highly energetic thermal radiation. The heating may result in a connection which is strengthened in comparison with mechanical application between the upper material coating and the lower material coating and/or a change in the chemical and/or physical properties of the material coating applied. For example, the irradiated material coating may melt under the action of the thermal radiation or become introduced into the base material of the contact element and form therewith an alloy or a frozen mixing phase. Different material coating scan also react with each other at the boundary faces thereof and can form desired chemical compounds at those locations.

So that the heating operation carried out by the thermal radiation can take place more rapidly after the mechanical application, there is a provision according to another advantageous configuration for the material coating to be dried after the mechanical application. This is preferably heated to a temperature which is below the melting temperature of the lowest-melting component of the at least one material coating applied and/or the softening temperature or a phase transition temperature, for example, the softening temperature of the base material.

It is particularly advantageous for an active region in which the highly energetic thermal radiation acts on and heats the contact element or the functional region to comprise at a maximum the at least one material coating in terms of surface-area. This may be carried out by bundling, focusing and/or masking the thermal radiation so that it strikes the material coating in the form of at least one thermal beam. In order to obtain greater processing speeds, the thermal radiation can also be divided into a plurality of thermal beams which can be directed simultaneously onto a plurality of material coatings which are dispersed over the contact element.

The heating of the material coating by the highly energetic thermal radiation is preferably carried out in a point-like manner with a precision of less than 0.1 mm so that the supply of energy is carried out in a highly precise manner. The greatest diameter of the active region in the face of the contact element is less than 0.1 mm during such a method implementation. The smallest achievable diameters of the active region can correspond substantially to the wavelength of the highly energetic radiation. By the thermal beam being expanded or by the face to be irradiated being covered, particularly in a grid-like manner, by means of a thermal beam which is focused in a point-like manner, relatively large surface-areas can also be processed.

Owing to the high resolution, it is possible for the heat to act only in small regions. For instance, regions whose dimensions are in the region of the resolution can be selectively melted or heated in order to change the chemical and/or physical properties in a limited manner locally at that region.

The local heating in the material coating is controlled by means of the energy density, the accelerating voltage, the particle beam and the active time of the thermal radiation. Those beam parameters are momentarily changed in accordance with the position of the active region and/or the material composition of the material coating currently in the active region. The beam parameters are preferably controlled in such a manner that at least one component reaches the molten state in the material coating affected by the current active region.

In an advantageous configuration of the method, the base material of the contact element is heated and/or melted by the thermal radiation superficially at most. The melt depth is preferably between 0.05 μm and 20 μm.

By the beam parameters being changed in a controlled manner, for example, in accordance with the thickness and/or composition of the material coating affected by the active region, the melt depth can be controlled in such a manner that a desired number of boundary faces between adjoining material coatings and/or between the bottom material coating and the base material is melted.

According to another advantageous configuration of the method, the beam parameters of the highly energetic radiation can be adjusted in such a manner that the depth at which the maximum application of energy takes place can be selectively adjusted. For example, the parameters can be adjusted in such a manner that only one boundary layer between the base material and the material coating is melted whilst the surface of the material coating is only heated slightly. In the case of highly energetic particle radiation, for example, electron, ion or atom radiation, the adjustment of the depth of the maximum energy application can be carried out by controlling the kinetic energy. This can be carried out by the frequency being controlled or selected in the case of highly energetic radiation with wave-like character, for example, in laser radiation or X-ray radiation.

Furthermore, heating of the material coating in the active region can be controlled by adaption of the beam parameters in such a manner that heating is carried out with thermal equilibrium.

By the material coating being heated, in particular melted, by means of the thermal beam, it is possible to compress and/or degas the material coating in another advantageous configuration of the method. Furthermore, pores can be closed and/or material defects can be removed.

Furthermore, it is possible to control the cooling rate of the at least one material coating heated in the active region by the beam parameters being controlled. For instance, it is possible to bring about gradual cooling with thermal equilibrium by the application of energy gradually being reduced or sudden cooling of the at least one material coating by the energy application suddenly being reduced.

The active region having a typical dimension of less than 0.1 mm is substantially smaller than the contact element which generally has a size of from several millimetres up to several centimetres. The mass heated by the active region is therefore preferably substantially smaller than the mass of the contact element. The heating of the at least one material coating heated in the active region is therefore carried out adiabatically or quasi-adiabatically because the energy applied by highly energetic thermal radiation is a great deal greater than the energy dissipated during the same time by means of thermal conduction. The cooling takes place so rapidly, owing to the size relationships between the active region and the contact element, that the molten material coating in the active region is frozen when the thermal radiation is switched off. Consequently, it is possible to achieve amorphous, micro-scale and/or nano-scale grains in the material coating by means of the method according to the invention. Such grains are chemically inert and extremely wear-resistant. The adiabatic or quasi-adiabatic heating results in the thermal action of the thermal radiation being limited only to narrowly delimited regions of the order of magnitude of the beam resolution.

In another advantageous construction, various grains can be produced in one material coating. This results, for example, in a material coating being able to have particularly hard and wear-resistant regions which can be fitted to regions with locations of the functional region at which counter-contacts strike the contact element or can rub along the contact element.

A surface structure on the material coating can further be produced by means of the thermal radiation. For example, a microstructure in the form of a grid-like contact can be produced. Furthermore, the tribological properties of the top material coating can be influenced by the surface structure. The size of the structural elements formed by means of the thermal radiation is preferably less than 20 µm and is therefore preferably in the microscopic range.

Consequently, it is possible to produce regions having different mechanical properties in the functional region in regions of the same material. Those different mechanical properties can be produced, as set out above, by the energy application in the material coating being changed in terms of time and space and by the heating and cooling rate and/or the temperature in the active region being controlled in that, for example, different grain structures are produced over the superficial extent of the material coating.

According to another advantageous construction, the highly energetic thermal radiation can be used to process a contact element which may be present in strip-like or band-like form or individually before and/or after the production of a functional region. For example, the highly energetic beams from the same beam source as is used for the thermal radiation can be used in the form of electron beams or ion beams for cutting, drilling, hardening and bending the contact elements.

If an electron beam is used as the highly energetic thermal radiation, it can be used for visualisation and quality control by means of electron-optical imaging methods in another advantageous construction. This may occur during the processing operation or afterwards in a separate step. For example, scanning electron microscope methods may be used for visualisation.

As mentioned in the introduction, a contact element according to the invention has at least one functional region which is provided with at least one mechanically applied material coating.

There may be provided as the functional region a contact location which has a contact point comprising a material coating which has smaller electrical resistance than a material coating which surrounds the contact point. The material coating which surrounds the contact point may have higher corrosion resistance than the contact point itself. In particular, lower-grade metal materials may be contained in the material coating of the region surrounding the contact than in the material coating of the contact point.

In another advantageous construction, the functional region may be in the form of a connection region which is intended to make it easier to fit soldering and/or crimping connections. Such a connection region may have, for example, a mechanically applied material coating containing tin.

The invention is explained below in greater detail with reference to embodiments and the drawings. The features which are different in the individual embodiments may be combined with each other in accordance with the above explanations. Furthermore, individual features in the embodiments may also be omitted in accordance with what has been set out above, if the advantage associated with this feature is not important in the particular application.

DETAILED DESCRIPTION OF THE DRAWINGS

First, the invention is described with reference to the embodiment schematically illustrated in FIG. 1.

Figure 1:
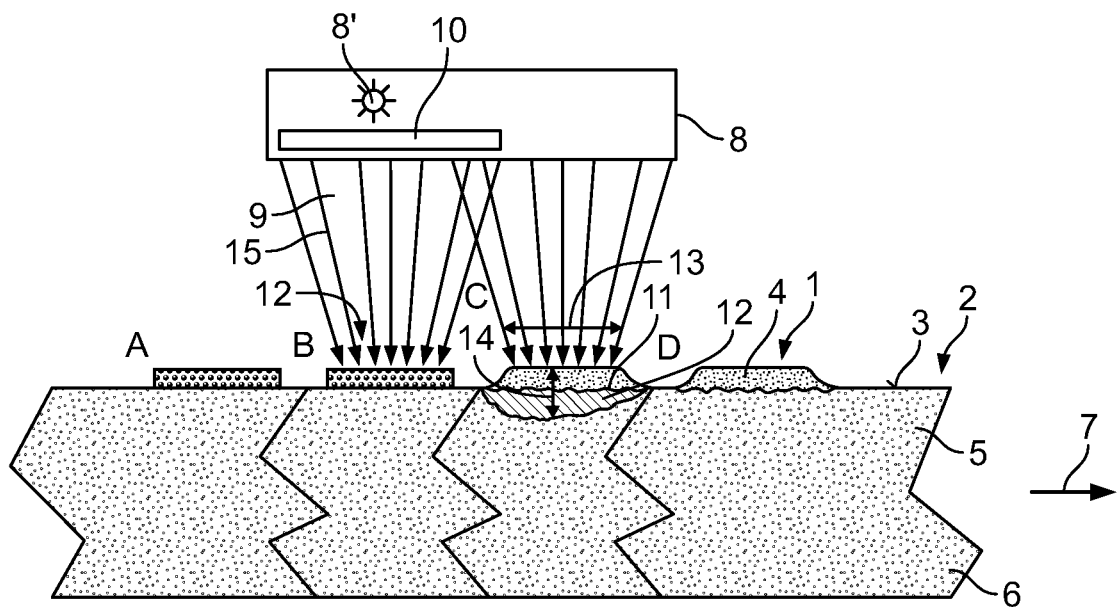
FIG. 1 is a schematic illustration of the method steps in accordance with a first embodiment of the method according to the invention.

FIG. 1 shows a method with which at least one functional region 1 of a contact element 2 is produced. The functional region 1 is a region which is limited in terms of surface-area to a portion of the surface 3 of the contact element 2 and which performs a particular function in the assembled contact element 2. The functional region 1 is, for example, a contact location which a counter-contact (now shown) abuts and via which electrical currents are intended to flow during operation. The functional region 1 may also be a connection region, to which a conductor is securely connected in the assembled contact element 2, for example, by crimping or soldering. The functional region 1 may also differ from the remaining region of the surface 3 of the contact element 2 owing to a high mechanical surface load in the case of an assembled contact element 2. For example, the contact element 2 can be supported movably so that an increased surface wear has to be anticipated at the support location. This applies similarly to regions at which other components are supported on the contact element.

As FIG. 1 shows, at least one material coating 4 is provided in the functional region 1.

The functional region 1 can be produced if the contact element 2 is not yet in individual form and is still in the form of a band-like or strip-like material 5, from which it is then separated by punching or cutting. Alternatively, the functional region 1 can also be produced in contact elements 2 which have already been separated. The contact element 2 or the strip-like material 5 is preferably produced from a homogeneous base material 6, in particular copper or a copper alloy. Before the functional region 1 is produced, the contact element 2 which is separated or in the form of the strip-like material 5 may already have been coated, for example, with nickel or tin.

FIG. 1 illustrates the production of a functional region 1 merely by way of example which is transported past a merely schematically illustrated production station 8 having a radiation source 8' in an advance direction 7. The advance of the strip-like material 5 can be carried out continuously or intermittently.

According to the first embodiment, the production of the functional region 1 may be carried out schematically in four method steps A, B, C, D. The method steps A to D are illustrated in FIG. 1 beside each other purely for the sake of clarity. In fact, the individual method steps can be carried out at stations which are successive in the direction of the band advance 7 and/or at one and the same location with the band-like material 5 being stationary or with a production station 8 which is also moved with the band-like material 5. In particular, the direction of the highly energetic thermal radiation 9 may also be synchronized with the band advance so that the thermal radiation remains directed onto only one functional region with continuous band advance.

In a first method step A, the material coating 1 is mechanically applied to the base material 6. This is carried out in particular by means of printing, for example, with screen printing, inkjet printing, gravure printing or direct stamp printing or stamp printing which is indirect via intermediate carriers. For example, intermediate rollers can be used as intermediate carriers.

The composition of the material coating 1 is adapted to the function of the functional region 1 and the necessary mechanical properties arising from that function. In particular, the material coating 4 may be constructed from a printable, metal-containing paste. The paste may contain powder, microparticles and/or nanoparticles comprising one or more pure metal components, carbon and/or metal compounds.

If the functional region 1 is a contact location, typical basic components for the material coating are gold, silver, copper, nickel, tin, palladium, platinum, and/or ruthenium. Those metals may particularly constitute the basic component of the printable metal pastes.

Furthermore, the material coating 4 may have additional components, in particular titanium, vanadium, chromium, manganese, iron, cobalt, niobium, zirconium, nickel, molybdenum, tantalum and/or tungsten and/or admixtures of those additional components. Metal compounds in the material coating 4 which is printed in accordance with method step A are selected in such a manner that they can be chemically reduced to metal in the subsequent method steps.

The metal coating 1 may also have non-metallic properties or contain non-metallic substances. A non-metallic characteristic of the material coating can also be obtained by a chemically stable metal compound which constitutes the basic component of the material coating 4. For example, the material coating 4 may be constructed from or contain a metal/carbon compound in the form $Me_yC_x$, a metal oxide in the form $Me_yO_x$ and/or a metal/nitrogen compound in the form $Me_yN_x$, one or more the above-listed basic and/or additional components being able to be considered as the metals. Carbon in the material coating 4 can be present during the mechanical application in chemical configurations such as graphite, diamond, carbon nanotubes, graphene or fullerenes.

The printing in method step A is carried out with high local resolution, that is to say, with high precision. The positioning precision and/or the smallest dimensions of a mechanically applied or printed, point-like material coating 4 are preferably less than 0.1 mm. Larger faces can also be printed in an associated manner.

In the next method step B, a highly energetic thermal radiation 9 is directed from the radiation source 8' onto the material coating 4 or the functional region 1.

The highly energetic radiation source is particularly particle radiation, such as, for example, electron radiation or ion radiation or radiation comprising other subatomic particles, but radiation having a wave-like character such as, for example, laser or X-ray radiation can also be used.

The highly energetic thermal radiation 9 is preferably bundled, focused or shielded by a device 10 so that no more than the functional region 1 having its at least one material coating 4 is irradiated.

Before the highly energetic thermal radiation 9 is directed onto the at least one material coating in the functional region 1, a drying step (not illustrated) can be carried out in which the mechanically applied or printed material coating 4 is dried. An oven is preferably used in order to accelerate the drying. The drying temperature is preferably below the softening temperature or a phase transition temperature, for example, the softening temperature of the base material 6 and preferably also below the melting temperature of the lowest melting component in the at least one material coating 4.

In method step B, the material coating 4 is heated with an increasing active time until it melts in method step C. The energy application of the highly energetic thermal radiation 9 can be controlled in such a manner that a boundary face 11 between the base material 6 and the material coating 4 also begins to melt. As a result, an intimate connection at the boundary face 11 between the base material 6 and the material coating 4 is brought about.

Subsequently, the highly energetic thermal radiation 9 is switched off or is directed away from the material coating 4 which has just melted so that it cools.

After the cooling, in method step D, there is a material coating 4 which is securely connected to the base material 6. The dimensions of the material coating 4 or the functional region 1 are very precise owing to the mechanical application method. Owing to the irradiation, those dimensions and positioning do not change over the method steps A to D so that the precision of the application method is retained.

Since the highly energetic thermal radiation 9 only acts, in comparison with the total contact element 2, in a very small active region 12 which is limited in terms of the surface-area substantially to the beam cross-section 13 and a small active depth which preferably extends only approximately from 0.05 µm to 20 µm into the base material 6, the heating of the active region 12 takes place under adiabatic or quasi-adiabatic conditions. Owing to the large mass particularly of the base material 6, the cooling takes place so rapidly and brings about such a steep heat dissipation gradient that frozen grain states with in particular amorphous, micro-scale or nano-scale grains are present.

The heating of the material coating 1 in the active region 12 is controlled by means of the parameters of the highly energetic thermal radiation 9 or the thermal beam 15 which is bundled by the device 10. The beam parameters are adjusted in accordance with the geometric properties of the material coating 4 such as, for example, the thickness and the structure thereof and/or the material properties of the material coating 4, such as the density, thermal conductivity thereof and the melting points of the individual components.

For the method illustrated in FIG. 1, the radiation parameters set out in Table 1 can be adjusted if the highly energetic thermal radiation 9 is an electron radiation having a beam diameter of 100 µm. In principle, beam diameters of from 0.2 µm to 1 cm are conceivable, preferably from 20 µm to 1 mm. In this instance, beam diameters which are greater than the intended melting depth are advantageous.

Active depths 14 between 1 µm and 5 mm can be achieved for a beam cross-section 13 having a beam diameter of 100 µm.

TABLE 1

| Radiation parameters | Value |
| --- | --- |
| Active time | 0.1-1000 microseconds |
| Beam redirection rate | $1-10^3$ m/s |
| Power density | $1-10^{10}$ W/mm$^2$, preferably $10^2-10^6$ W/mm$^2$ |
| Accelerating voltage | 1-100 kV |
| Electron flow | 0.1-100 mA |
| Total power | 1-1000 (5000) Watt |
| Heating rate | $10^4-10^{10}$ K/s |

The highly energetic thermal radiation 9 can be directed onto the functional region 1 in a pulse-like manner, which is advantageous, for example, in the case of intermittent band advance 7 the functional region 1 is subsequently irradiated selectively by the radiation source 8' when it is located under it, that is to say, under the production station 8 in the example of FIG. 1.

A change in the energy application may be brought about not only by changing the radiation energy and/or radiation energy density but also in that the radiation pulse duration or the time intervals between radiation pulses are changed. For instance, the thermal energy contained in a material coating 4 can be increased if the time interval between radiation pulses is reduced.

Figure 2:
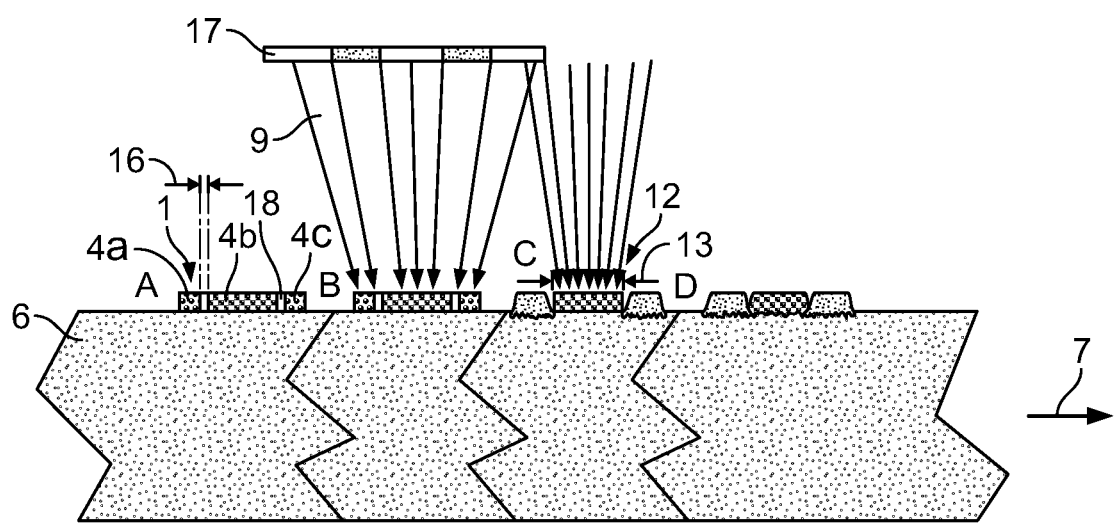
FIG. 2 is a schematic illustration of the method steps in accordance with a second embodiment of the method according to the invention.

FIG. 2 illustrates another embodiment of the method according to the invention. In the method step A, a plurality of material coatings 4a, 4b, 4c are applied beside each other. Three material coatings are arranged beside each other in FIG. 2 merely by way of example.

The material coatings 4a, 4b, 4c can be composed of identical or different materials. Owing to the high degree of precision of the printing method, the material coatings 4a, 4b, 4c are placed exactly beside each other. A spacing 16 between the material coatings substantially corresponds to the precision of the application method, which is ideally free of spacing but is preferably at worst 0.1 mm in a practical implementation.

The material coatings 4a, 4b, 4c are part of a coherent functional region 1.

In method step B, the highly energetic thermal radiation 9 is again directed onto the three material coatings 4a, 4b, 4c. Owing to a mask 17 which can preferably be varied or controlled and which can be part of the device 10, and/or a defined beam layout, for example, a diffraction image produced by a diffraction grating 17' and by programmed redirection of the beam, it is possible to adjust the size and shape of the beam cross-section 13 and the energy distribution over the beam cross-section 13 preferably in a variable manner. Consequently, the highly energetic radiation 9 is also limited to the functional region 1 in this embodiment.

If the material coatings 4a, 4b, 4c are constructed from different materials, the irradiation with the highly energetic thermal radiation 9 is first carried out in a first irradiation step with an energy application which allows the most rapidly melting material coating to melt (in this instance, these are the two material coatings 4a, 4c). In particular, at least one beam pulse can be directed in this irradiation step onto the total functional region 1 which immediately melts the two rapidly melting material coatings 4a, 4c. The radiation parameters which have to be adjusted accordingly are set out above in Table 1.

After the highly energetic radiation 9 has been switched off at the end of the method step B, the two previously molten material coatings 4a, 4c solidify.

In a second irradiation step, method step C, highly energetic radiation 9 is again directed onto the functional region 1. The highly energetic radiation 9 is focused onto those regions which could not yet be melted in the preceding irradiation step because they require more energy to melt. In method step C, those regions are now melted. In order to limit the active region 12 to the non-molten material coating 4b, the functional region 1 can be positioned during the continuous or discontinuous band advance 7 under another production station 8 which produces a corresponding beam cross-section which is adapted to the base face of the material coating 4b which is intended to be melted. Alternatively, the mask 17 and/or a device 10 can also be changed so that the beam cross-section 13 changes. Owing to the adiabatic or quasi-adiabatic method implementation, the heat supply does not act on the other side of the active region 12 whose base face corresponds to the beam cross-section 13.

After the method step C, if other non-molten material coatings are still present, the next irradiation step can be carried out similarly, the beam cross-section 13 being adapted to the base face of the material coating(s) still remaining. This can be repeated until all the material coatings are melted.

In the method step D, a functional region 1 is then present with adjacent molten and solidified material coatings 4a, 4b, 4c. The physical properties of those material coatings depend on their material composition.

Owing to the melting, gaps 18 which occur during the mechanical application between the adjacent material coatings 4 can be levelled so that a smoother surface is produced.

Figure 3:
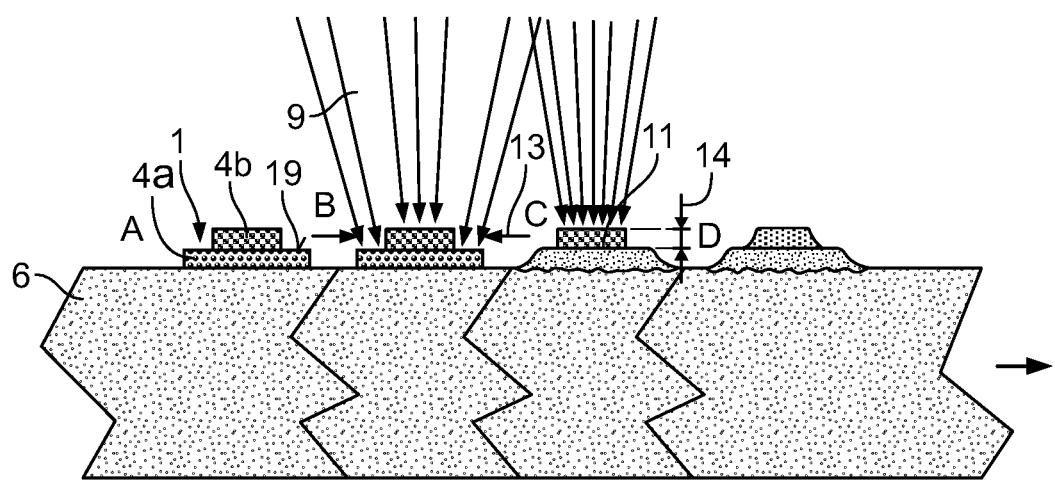
FIG. 3 is a schematic illustration of the method steps of a third embodiment of the method according to the inventor.

In the embodiment of FIG. 3, the method is modified in that two material coatings 4a and 4b of a functional region are now arranged one above the other. Merely by way of example, FIG. 3 shows only two material coatings 4a, 4b located one above the other. The number of material coatings one above the other further results from the requirements of the properties of the functional region 1.

As FIG. 3 shows, the lower material coating 4a can have a greater base face than the upper material coating 4b. In particular, the lower material coating 4a preferably projects annularly round the upper material coating 4b so that a shoulder 19 which is subjected to the highly energetic radiation 9 is produced. The shoulder is preferably not smaller than the smallest beam diameter 13.

The material coatings 4a, 4b can be constructed from different materials so that they require different levels of energy and/or temperatures to melt.

The additional method steps B to D substantially correspond to the method steps of the method according to FIG. 2: first, highly energetic thermal radiation 9 is directed onto the total functional region 1, the energy application being limited to the rate which is necessary to melt the material coating which melts first; this is preferably the lower material coating 4a. The highly energetic radiation can again be produced in the form of a pulse.

The beam cross-section 13 in method step B corresponds to the base face of the bottom coating 4a. After the highly energetic radiation 9 is switched off, at the end of method step B, the material coating 4a solidifies.

In method step C, highly energetic radiation 9 is again directed onto the functional region 1. The beam cross-section 13 is limited to the material coating(s) which has/have not yet melted and which is/are on the already molten material coating. Only the upper material coating 4b is melted by the locally limited supply of radiation energy, the active depth 14 extending into the boundary face 11 between the material coatings 4a, 4b.

If there are still other material coatings which have not yet melted in method step C above the material coating 4b, this step can be repeated with a beam cross-section adapted to the base face of those material coatings.

At the end, in method step D, there is present a functional region 1 having a plurality of coatings which are located one on the other and whose physical properties depend on the material composition.

The lower coating 4a may be, for example, a corrosion or diffusion protection coating which either brings about chemical isolation between the upper material coating 4b and the base material 6 or protects the base material 6 against corrosion in the region around the material coating 4b, for example, in the manner of a sacrificial anode.

Since the highly energetic radiation 9 can be focused onto a very small region, the smallest beam cross section 13 substantially corresponds to the wavelength of the highly energetic radiation 9, the beam cross-section 13 and therefore the active region 12 can be adjusted very precisely.

Figure 4:
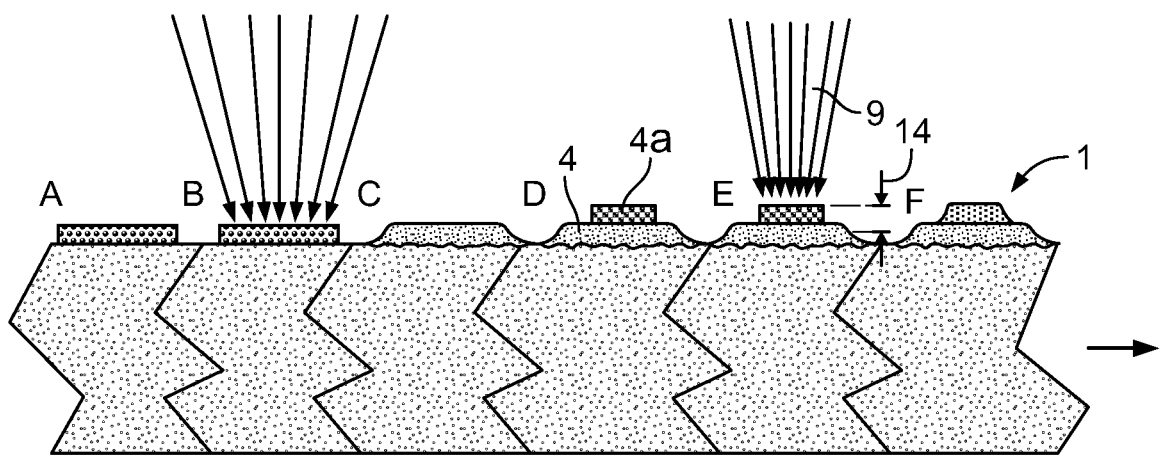
FIG. 4 is a schematic illustration of the method steps of a fourth embodiment of the invention.

FIG. 4 illustrates a development of the method of FIG. 3.

The method steps A to C in FIG. 4 correspond to the method steps A to C of FIG. 1. In method step D, an additional material coating 4a is mechanically applied, for example, printed, onto the already-present material coating 4 which has already been heated and/or melted. In this instance, the high resolution of the mechanical application method also allows exact positioning of the material coating 4a on the material coating 4 below. Subsequently, in the method step E, the material coating 4a is heated and/or melted by means of the highly energetic radiation 9 so that a functional region 1 constructed from two material coatings 4, 4a located one above the other is again obtained as a result. If additional material coatings are required, the method steps D and E can be repeated.

The method shown in FIG. 4 is particularly suitable for upper material coatings 4a which completely cover the lower material coating. The radiation parameters for each newly applied upper material coating 4a are adjusted in accordance with the geometric properties and/or material properties of the material coating 4a in order to melt the lower material coating 4 only as far as the desired active depth 14.

Figure 5:
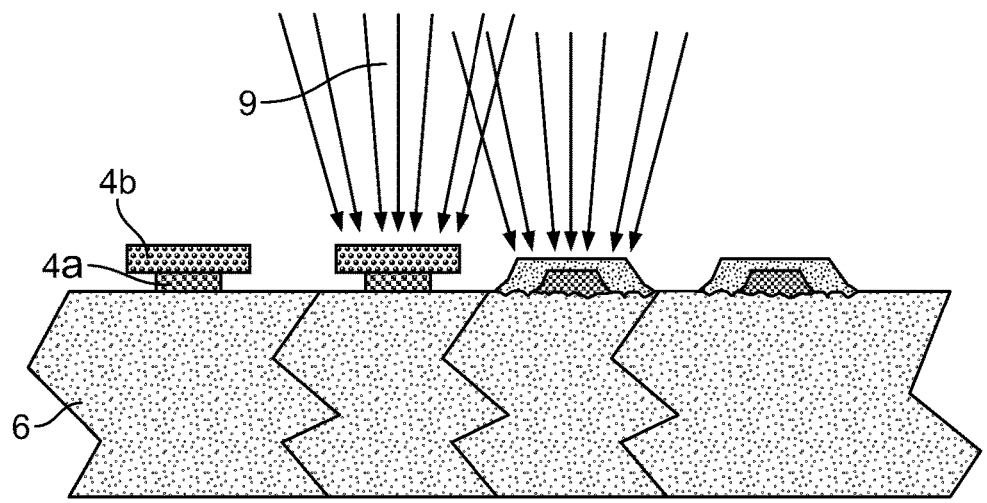
FIG. 5 is a schematic illustration of the method steps of a fifth embodiment of the invention.

FIG. 5 shows another advantageous configuration of the method. The upper material coating 4b projects beyond the lower material coating 4a in terms of surface-area.

The method steps correspond to the method steps according to FIG. 1 to the greatest extent. The two material coatings 4a, 4b are preferably applied mechanically to the base material 6 at the same time. In an advantageous configuration of the method, the beam parameters of the highly energetic radiation 9 are adjusted in the subsequent method step B so that both material coatings 4a, 4b are melted at the same time. Owing to the melting operation in method step C, the upper material coating 4b completely covers the lower material coating 4a and isolates it from external influences such as, for example, corrosion.

Figure 6:
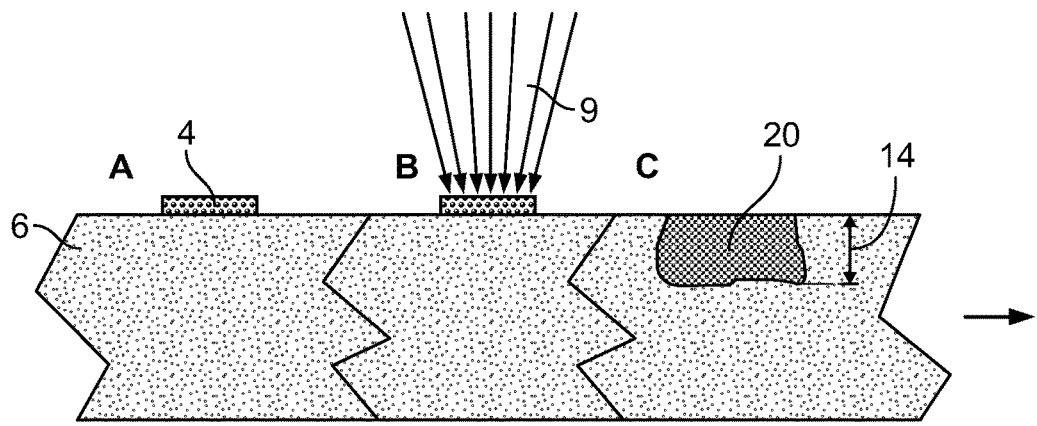
FIG. 6 is a schematic illustration of the method steps of a sixth embodiment of the invention.

With the method according to the invention, a mechanically applied material coating 4 can be alloyed in the basic material 6 or another material coating located under the material coating 4 in a locally narrowly limited region which is precise within the local resolution of the application method, or can be mixed therewith by means of convection in the liquid state and frozen. This is briefly explained with reference to FIG. 6.

In method step A, a material coating 4 is against first applied mechanically and subsequently, in method step B, subjected to the highly energetic radiation.

The radiation parameters are preferably selected so that the material coating 4 and the base material 6 underneath become heated and cool only slowly and, furthermore, a high active depth 14 is achieved.

If the material coating 4 contains materials or comprises materials which can be alloyed with the base material 6, the alloy constituents of the material coating 4 become diffused into the base material 6 owing to the heating by the highly energetic thermal radiation 9 so that an alloyed region 20 located in the base material 6 is produced. In accordance with the cooling rate, different lattice structures of the alloyed region 20 can be obtained.

Switching off the highly energetic radiation 9 suddenly, for example, brings about practically immediate cooling and therefore freezing of the lattice states. This results in hardening of the alloyed region 20 and a correspondingly hard, wear-resistant surface.

In a material coating 4 which cannot be alloyed with the base material or in a material coating 4 which can be alloyed with the base material 6 and in which the diffusion rate into the base material 6 is not high enough, that material coating 4 is heated together with a portion of the base material 6 by means of the highly energetic radiation 9 so powerfully that both melt and become mixed in the liquid state owing to convection. The resultant mixing phase is cooled so quickly by the highly energetic radiation being removed that its grain structure freezes and remains stable.

Figure 7:
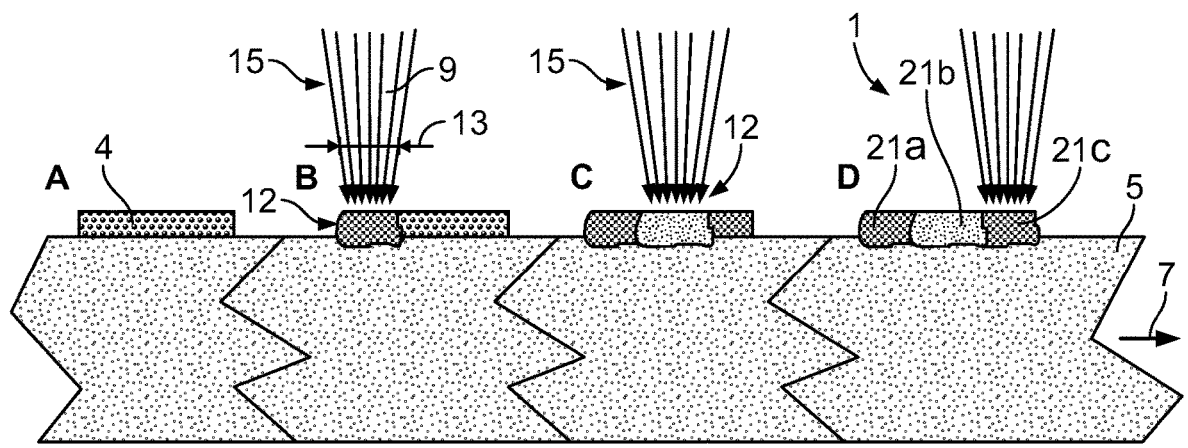
FIG. 7 is a schematic illustration of the method steps of a seventh embodiment of the invention.

FIG. 7 shows, by way of example, how a functional region 1 which has regions 21a, 21b, 21c having different mechanical properties is produced from an individual material coating 4 which is preferably homogeneously printed on.

First, in method step A, the material coating 4 is mechanically applied. Subsequently, the highly energetic thermal radiation 9 is directed onto a subarea of the material coating 4. The active region 12 is accordingly limited to that subarea. Owing to the high resolution and powerful focusability of the highly energetic radiation 9, the beam cross-section 13 or the extent of the active region 12 can be adapted precisely to the structural requirements, for example, the size of the subarea.

If, in method step B, for example, a region of little hardness is intended to be produced in the material coating 4, the radiation parameters of the highly energetic thermal radiation 9 are preferably adjusted so that the highly energetic thermal radiation 9 is directed at low power over a long active time onto the region 21*a* to be produced. The energy application by the highly energetic radiation 9 in the active region 12 is further varied over time in such a manner that the active region 12 cools after melting only slowly so that thermal loads decrease and the cooling is carried out with thermal equilibrium or near thermal equilibrium.

Subsequently, the beam 15 is moved over the material coating 4 into another part-portion in order to produce at that location a subarea having different mechanical properties. In method step C of FIG. 7, the beam 15 is moved into an adjacent region 21*b* for this purpose. Instead of beam movement, a new beam may alternatively also be produced, for example, by the band-like material 5 being moved during the advance movement 7 under a new production station 8 (not shown).

Owing to the exact positionability of the beam 15 with a precision of preferably less than 0.1 mm, the region 21*b* can be approached precisely relative to the region 21*a* already present. In that region, for example, great hardness can be achieved in that rapid heating and cooling of the active region 12 is produced with a high level of beam power over a short active time. The regions 21*a*, 21*b* can adjoin each other directly.

In subsequent method steps D, additional regions having different mechanical properties can be produced. In method step D, for example, an additional subarea 21*c* of the material coating 4 can be irradiated with radiation parameters which are again different in comparison with the subareas 21*a* and 21*b* in order to again achieve different hardnesses. Other physical properties can also be adjusted by the heating and cooling rate being controlled such as, for example, the resistance, ductility, conductivity or corrosion-resistance.

Figure 8:
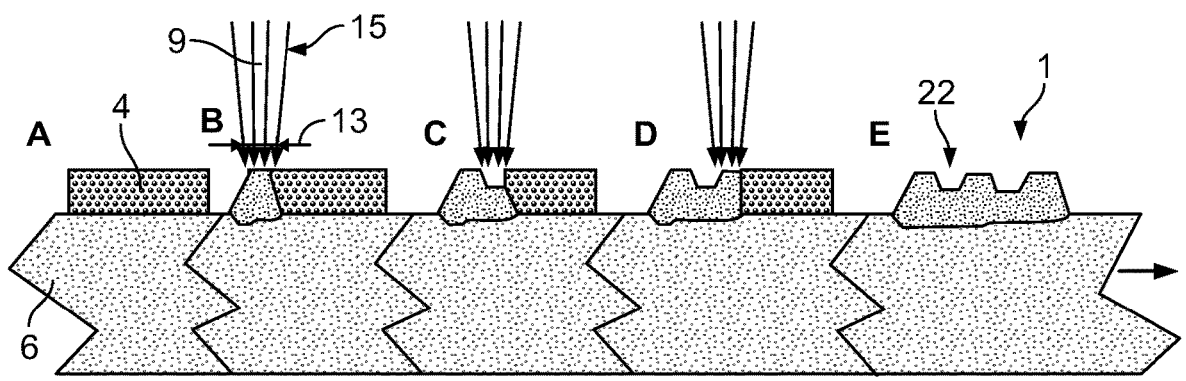
FIG. 8 is a schematic illustration of the method steps of an eighth embodiment of the invention.

As FIG. 8 shows, the method according to the invention can also be used to provide predetermined surface structures. Microscopic surface structures in an order of magnitude of preferably less than 20 µm can be produced.

To this end, in a method step A, a material coating 4 is applied mechanically to the base material 6. Subsequently, a beam 15 of highly energetic radiation 9 is focused onto a subarea of the material coating 4. The part-region comprises the cross-section 13 of the beam 15 and the active depth 14. The cross-section 13 of the beam 15 is preferably no greater than the smallest surface structure to be produced. The beam 15 is moved in a grid-like manner over the material coating 4 while the radiation parameters are changed, for example, in the case of successive radiation pulses with the radiation parameters set out in Table 1.

The surface can be structured, for example, if the material coating 4 is initially melted on or off or even evaporated over the entire depth with a radiation parameter adjusted to a depth action, for example, according to one of the above methods, and subsequently at the same location material is additionally melted on or off or evaporated by radiation parameters adjusted to surface action. Material which becomes free or is discharged can be deposited at the edge of the active region 12, whereby the affected region appears in a crater-like manner. Thus, channels can be produced in a method with continuous relative movement between the highly energetic radiation and the material coating 4.

If the entire surface of the material coating 4 has been scanned with the beam 15, a functional region 1 having a surface structure 22 is obtained.

Figure 9:
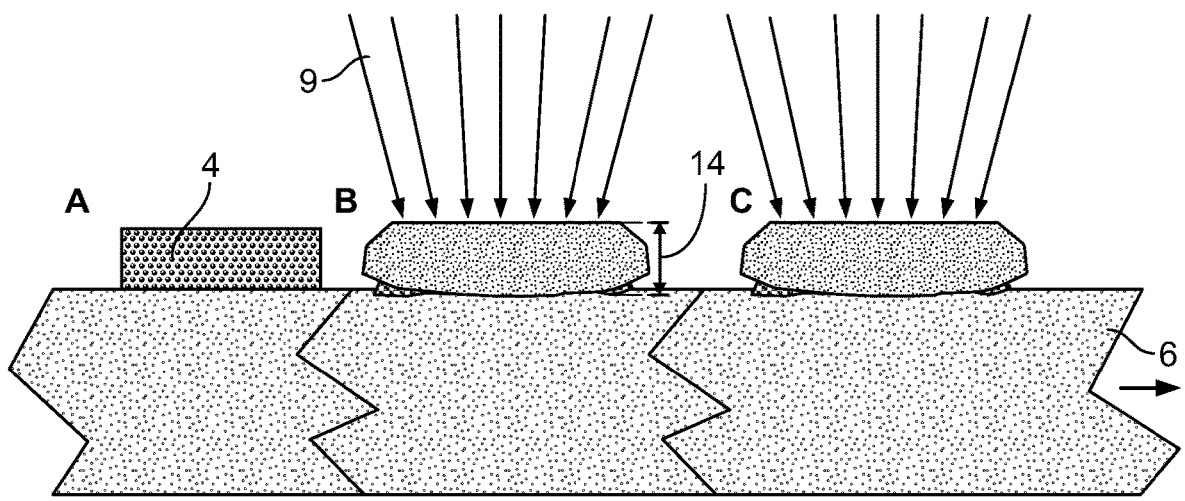
FIG. 9 is a schematic illustration of the method steps of a ninth embodiment of the invention.

The depth and surface action of the radiation parameters set out in Table 1 is explained with reference to FIGS. 9 and 10. If, according to FIG. 9, highly energetic radiation 9 is introduced in the case of an applied material coating 4, with, for example, low accelerating voltage, that is to say, a low energy level, over a short active time, only a small active depth 14 is obtained. Melting takes place primarily in the region of the surface of the material coating 4.

Figure 10:
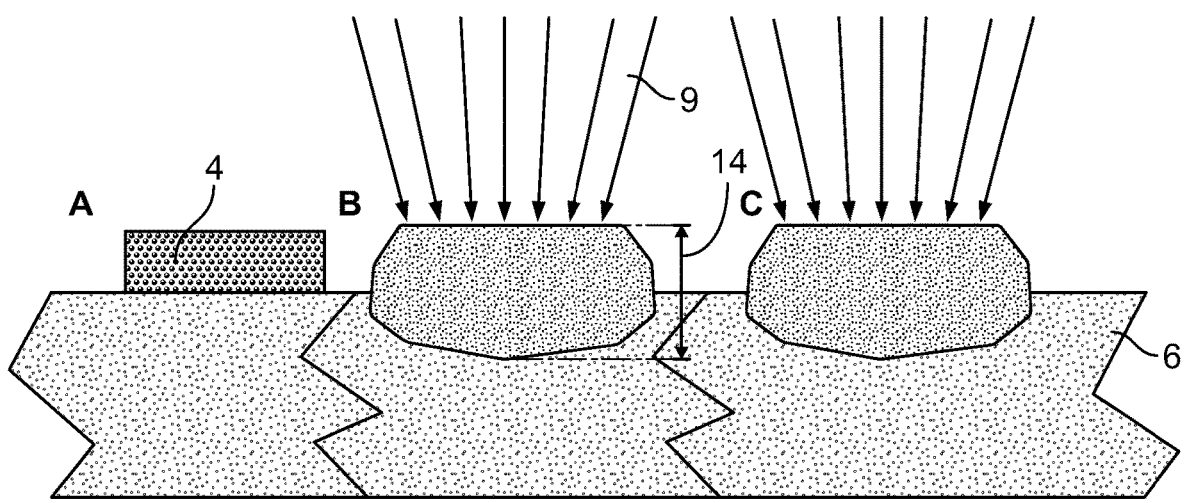
FIG. 10 is a schematic illustration of the method steps in accordance with a tenth embodiment of the invention.

As shown in FIG. 10, however, if a medium accelerating voltage is applied, a higher active depth 14 is obtained because the highly energetic radiation can penetrate more deeply into the base material 6. The base material 6 is also melted at a great depth and becomes connected to the material coating 4 which is also molten.

The grid-like coverage of the material coating 4 described in FIG. 8 with a beam 15 which affects only a subarea of the material coating 4 can be used in addition to or as an alternative to the method illustrated in FIGS. 1 and 3. This is explained briefly with reference to FIGS. 11 and 12.

Figure 11:
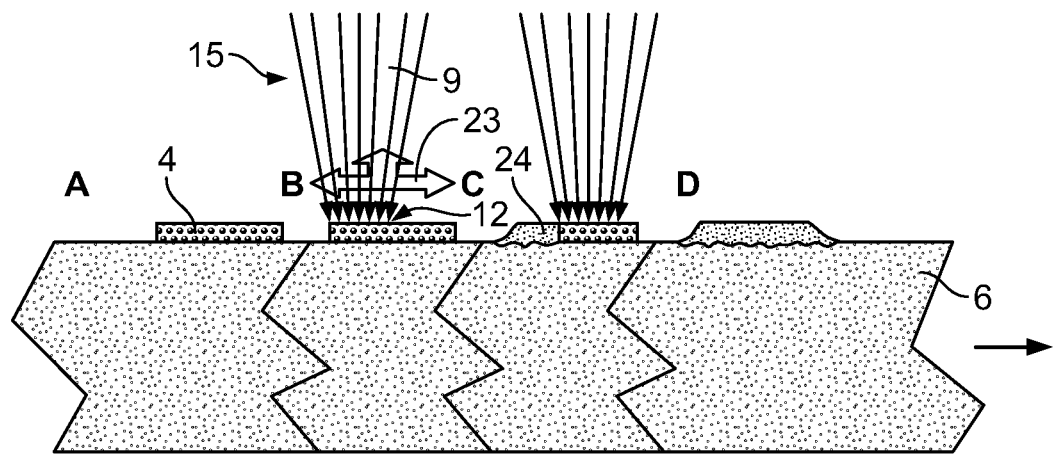
FIG. 11 is a schematic illustration of the method steps of an eleventh embodiment of the invention.

The material coating 4 which is applied in method step A of FIG. 11 is affected in a subarea by the beam 15 of highly energetic radiation 9. Consequently, the active region 12 extends only over a portion of the material coating 4. The beam 15 can now be moved continuously along a movement grid 23 over the material coating 4. Alternatively, the beam 15 is directed in a pulse-like manner onto different points arranged in a grid-like manner on the material coating 4.

During that grid-like movement, material coating regions 24 which are melted and which have already become molten with or soldered to the base material 6 are located directly beside regions which are still non-molten.

If the entire surface of the material coating 4 has been affected, the same result is present in method step D as in the method step D of FIG. 1.

Figure 12:
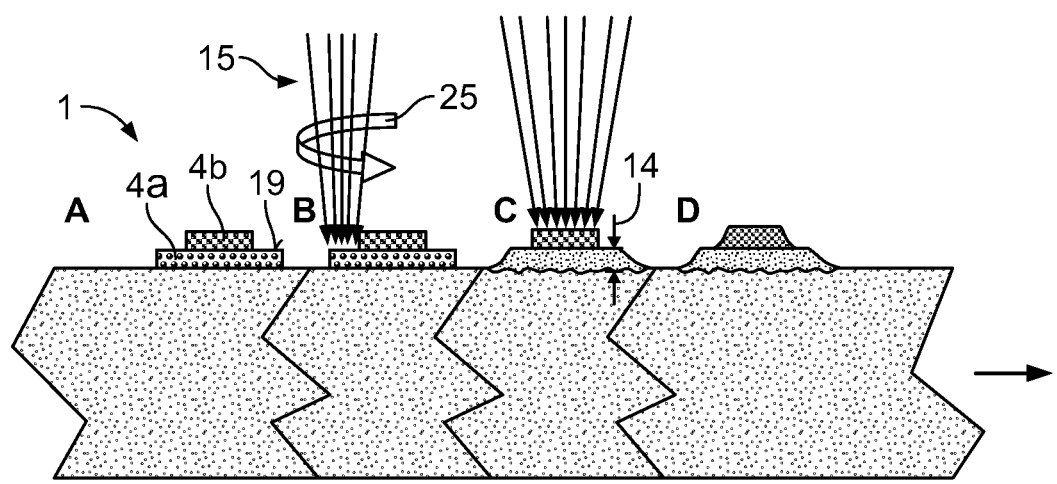
FIG. 12 is a schematic illustration of the method steps of a twelfth embodiment of the invention.

In FIG. 12, the method step B of FIG. 3 is replaced by grid-like irradiation of the shoulder 19 of the lower material coating 4*a* of a functional region 1. As indicated by the arrow 25, the beam 15 is guided along the shoulder 19 in a grid-like manner so that it is completely affected and melted. The radiation parameters are adjusted in such a manner that a great active depth 14 is achieved. If other shoulders 19 are present in upper coatings, the method step B can be repeated. Otherwise, the method is continued with the method steps C and D, as already described in FIG. 3. The radiation parameters of the highly energetic radiation 9 or the beam 15 are modified in relation to the method step B in accordance with the geometric properties and material properties of the material coating 4*b* now being irradiated. A pulse-like beam 15 which is successively directed onto the individual grid points can also be used in this instance.

Figure 13:
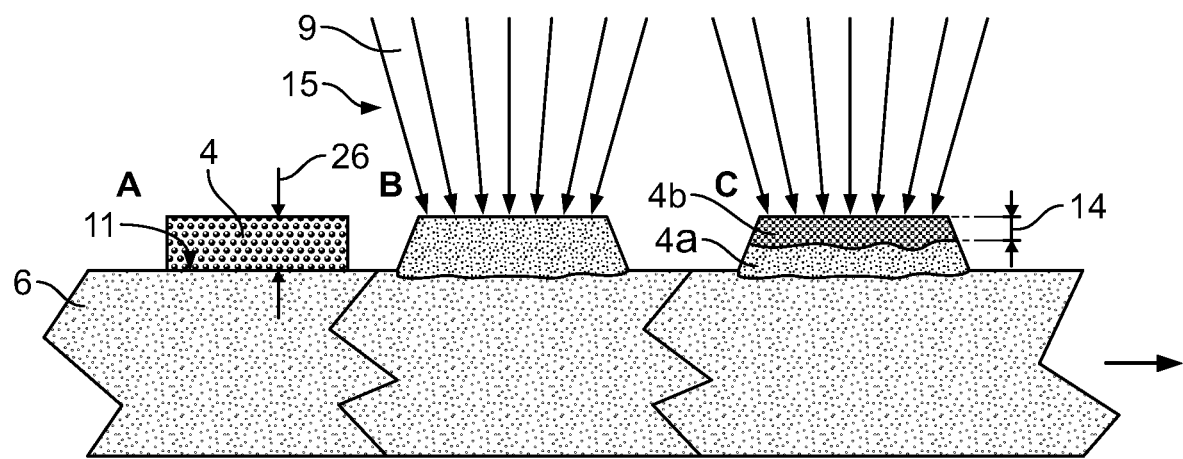
FIG. 13 is a schematic illustration of the method steps of a thirteenth embodiment of the invention.

With the method according to the invention, it is possible to produce not only regions having different properties beside each other in a homogeneously applied material coating 4, as described in FIG. 7. As FIG. 13 shows, coatings located one above the other with different properties can also be produced in a material coating 4 which is originally applied homogeneously.

To this end, the entire material coating 4 applied in the method step A and the boundary face 11 below are initially melted, in this instance the boundary face between the material coating 4 and the base material 6 merely by way of example. The beam 15 can be guided in a grid-like and point-like manner over the material coating 4 or can irradiate the entire material coating 4 simultaneously. The radiation parameters in the method step C can be adjusted in particular to a great active depth 14. At the same time, the temporal energy application in the method step B is dimensioned by the radiation 9 in such a manner that the molten regions cool suddenly and the grain state is consequently frozen. In the method step C, a repeated heating of the material coating 4 follows that hardening process, the radiation parameters of the radiation 9 being adjusted in such a manner that an active depth 14 which is only small and which is only a portion of a thickness 26 of the material coating 4 is achieved. The temporal energy application in the method step C owing to the radiation 9 can be controlled in such a manner that the cooling takes place more slowly in that region so that a more ductile upper coating 4b is produced on a hard lower coating 4a. Another coating having different mechanical hardness properties can be produced above the coating 4b by means of another optional method step (not shown) if the radiation parameters are adjusted in accordance with the method steps B (harder coating) or C (more ductile coating).

Alternatively, the radiation parameters can be adjusted in the method step B in such a manner that the depth of the maximum energy application is at the boundary face 11. In the case of particle beams, this can be carried out by controlling the kinetic energy of the particles. In the case of highly energetic thermal radiation 9 with wave-like character, this can be carried out by controlling or selecting the wavelength. It is thereby possible that only the material coating 4a melts whilst the material coating 4b is only heated slightly.

Owing to the high thermal conductivity of the metal pastes which are preferably used for the mechanical application and the very high mass, in comparison with the material coating 4, of the base material 6 which is also very thermally conductive, the repeated heating of the upper material coating 4b in the method step C does not impair the mechanical properties of the lower material coating 4a. The heat is dissipated into the base material 6 from the upper material coating 4b so rapidly that adjacent regions are not heated or are heated only to a negligible extent.

Figure 14:
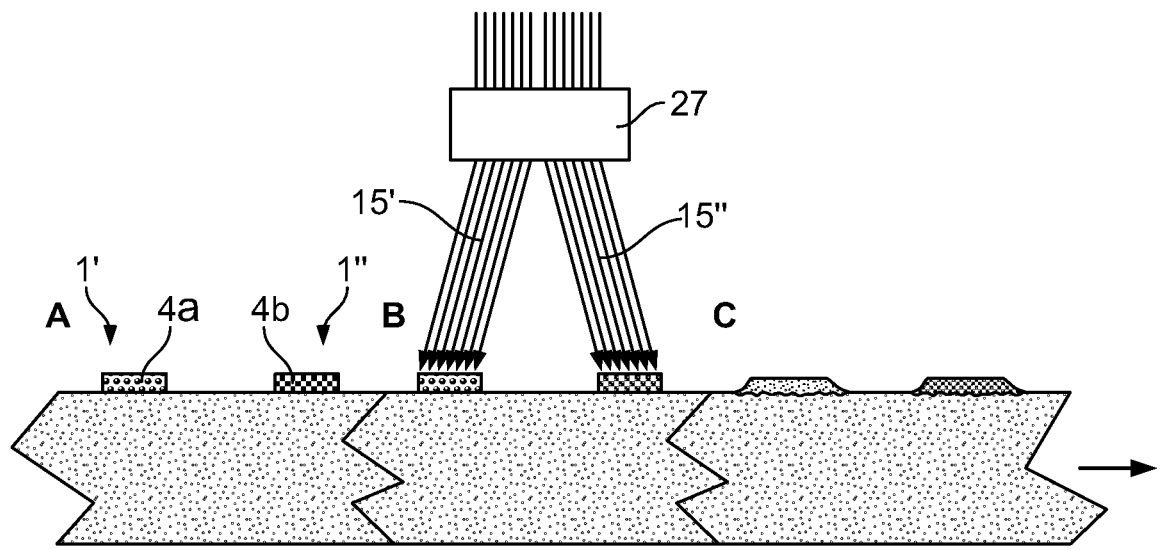
FIG. 14 is a schematic illustration of the method steps of a fourteenth embodiment of the invention.

FIG. 14 schematically illustrates how it is simultaneously possible to irradiate in a method step B, with two separate beams 15', 15" or a beam which is divided into two part-beams 15' and 15", two mutually spaced-apart functional regions 1', 1" which have been printed with material coatings 4a and 4b in a method step A. Functional regions 1' and 1" which are arranged with relatively large spacing from each other are thereby produced in one method step.

Figure 15:
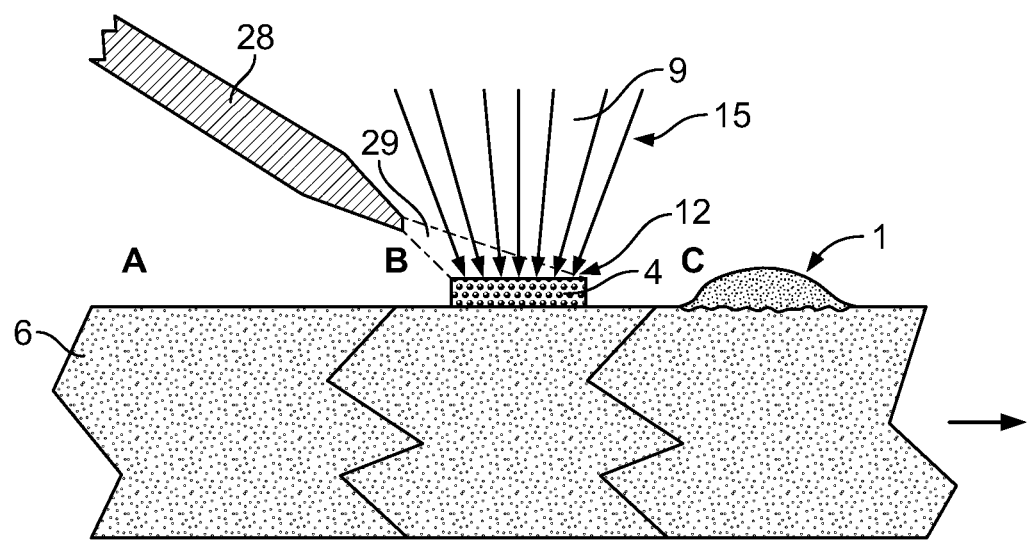
FIG. 15 is a schematic illustration of the method steps of a fifteenth embodiment of the invention.

FIG. 15 schematically illustrates how a material coating 4 can be applied mechanically to the base material 6 by means of spraying using a spraying tool 28. The spraying beam 29 can be directed onto the active region 12 of the highly energetic radiation 9. In the beam 15, the sprayed-on powder mixture which can have a material distribution and particle distribution melts and strikes in the form of drops the molten base material 6, to which it becomes connected. The additional powder coatings melt with the powder coatings below so that, coating by coating, a structure can be built up from the spraying beam 29. Powder not affected by the beam 15 can be collected and reused. The highly energetic thermal radiation 9 can be pulsed so that preferably only the upper material coating 4 can always harden again.

With the method schematically illustrated in FIG. 15, it is possible to produce a functional region 1 which has height contours and in which the material coating 4 has heights which are different in the surface direction. This can be achieved, for example, in that the beam 15 is moved in a grid-like manner over the base face of the functional region 1 with the spraying tool 28 being operated continuously. The longer the beam 15 pauses at a location, the more powder becomes baked on at that location and the higher the material coating 4 becomes at that location. Subsequently, the functional region 1 can be further processed according to one of the above-described methods, for example, with the method shown in FIG. 11 in order to produce coatings having different mechanical properties.

By means of spraying, it is also possible to construct material coatings 4 which are located beside each other or one above the other from different materials if the consistency of the spraying beam 29 is changed over time.

Figure 16:
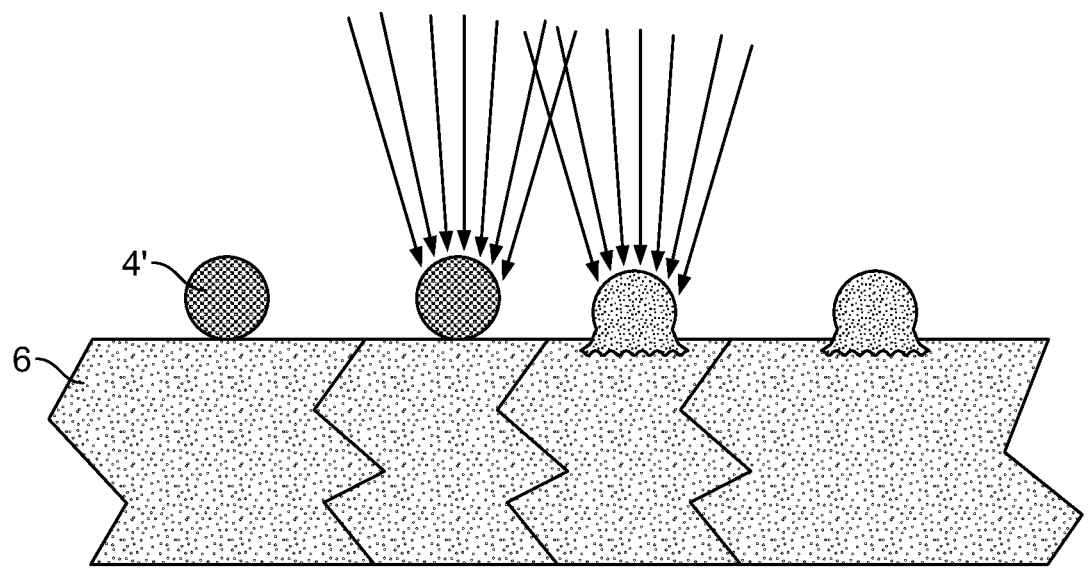
FIG. 16 is a schematic illustration of the method steps of a sixteenth embodiment of the invention.
Figure 17:
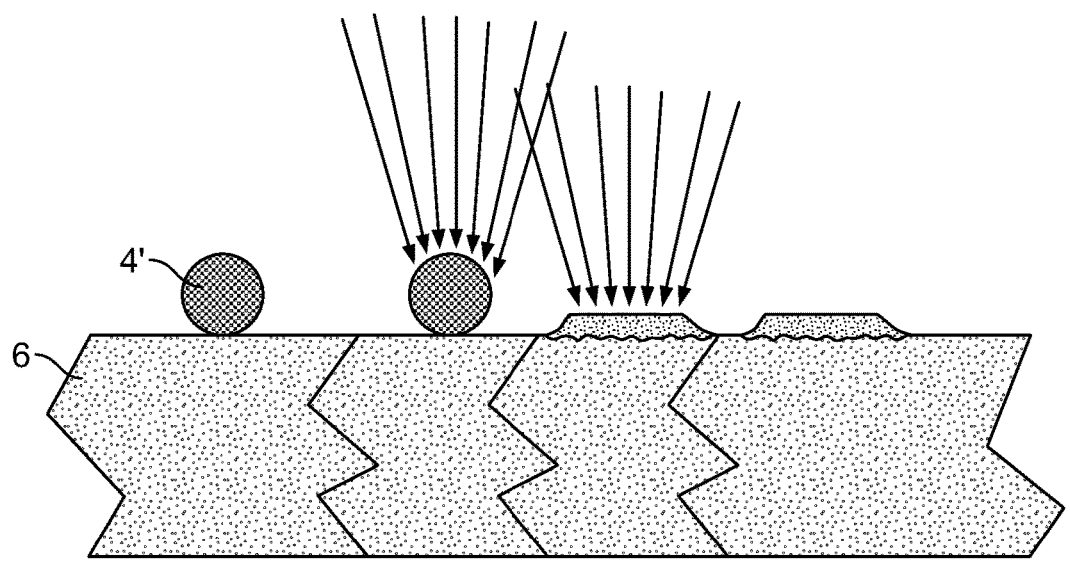
FIG. 17 is a schematic illustration of the method steps of a seventeenth embodiment of the invention.

As shown in FIGS. 16 and 17, the mechanical application of the material coating 4 can also be carried out by applying a wire 4' or a film 4" (not shown). In the subsequent method step B, the beam parameters of the highly energetic thermal radiation 9 can be adjusted in such a manner that the wire melts only partially and becomes connected to the base material 6, as shown in FIG. 16. Alternatively, as shown in FIG. 17, the beam parameters can be adjusted in such a manner that the wire applied melts completely and the resultant molten material coating has a profile which is flat instead. With the method schematically illustrated in FIG. 16, it is possible to produce a material coating 4 whose height profile varies in the surface direction.

Figure 18:
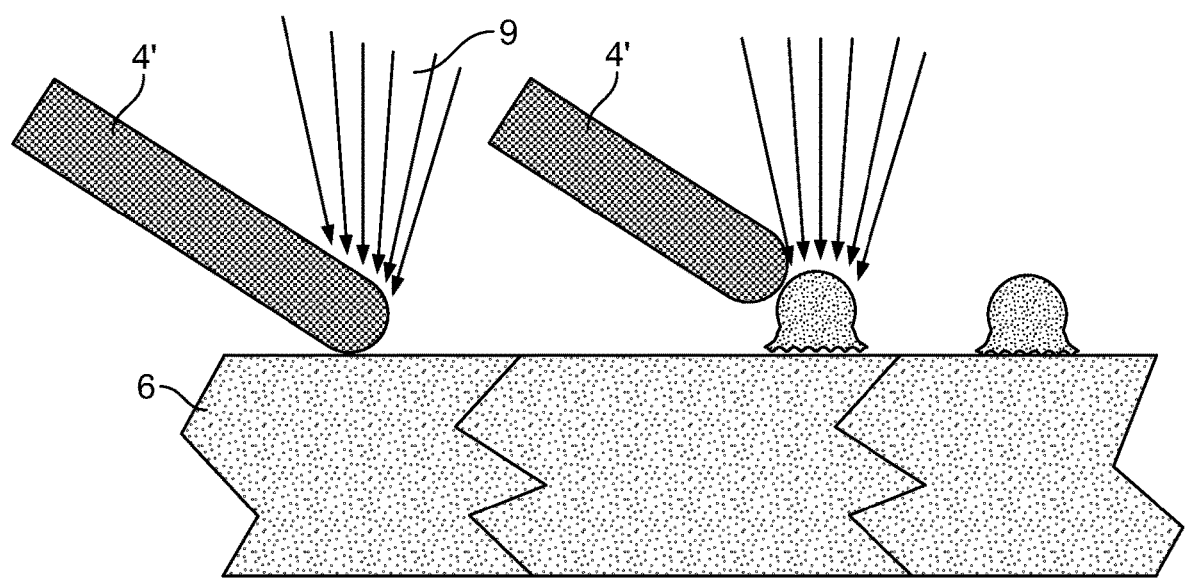
FIG. 18 is a schematic illustration of the method steps of an eighteenth embodiment of the invention.

In particular, the wire 4' or the film 4" can be introduced into the highly energetic thermal radiation 9 or the active region 12 which is affected by the highly energetic thermal radiation 9, as illustrated in FIG. 18. The material application may be carried out in a point-like manner or also in a linear or planar manner, the supply of wire 4' or film 4" being able to come from a roll.

With reference to FIGS. 19 to 22, embodiments of contact elements which have functional regions 1 produced in accordance with the method according to the invention are described below.

In the band-like material 5 which is moved in an advance direction 7, the functional regions 1 are first produced in accordance with one or more of the methods described above.

Subsequently, the contact element 30 is cut from the band-like material 5, preferably with the highly energetic thermal radiation 9 which has already been used to produce the functional regions 1.

Figure 19:
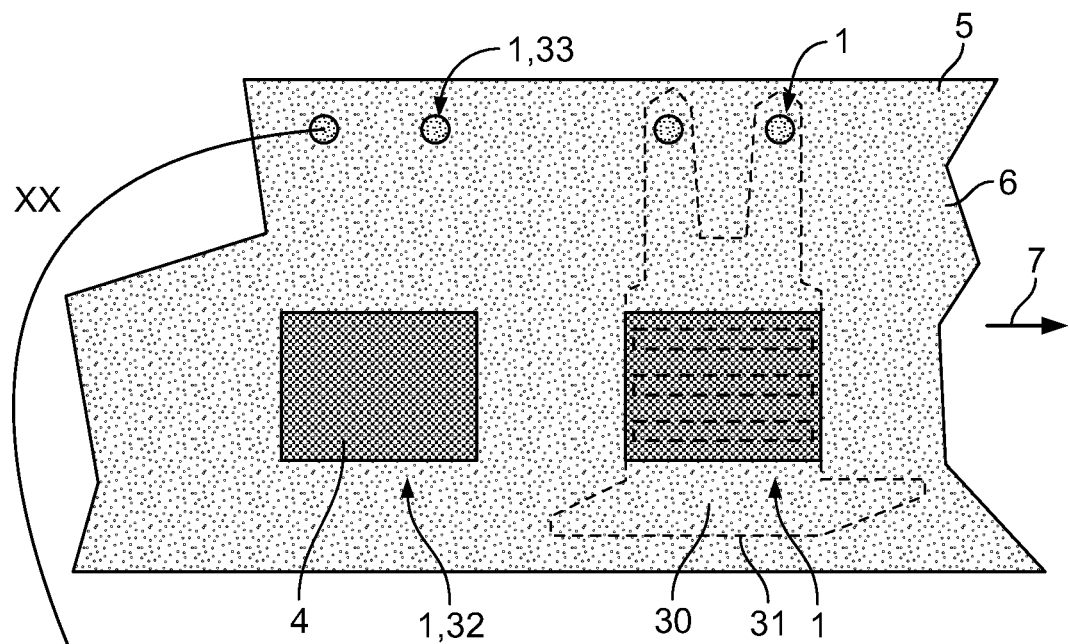
FIG. 19 is a schematic illustration of a contact element according to the invention during its production.

The highly energetic thermal radiation 9 can also be used for additional processing steps of the contact element 30 or the band-like material 5 in addition to cutting such as, for example, for hardening the base material 6 and for drilling and welding. The line 31, along which the contact element 30 is cut out by the highly energetic beam 9 (not shown), is illustrated in FIG. 19 as a broken line.

The contact element 30 has, merely by way of example, two different types 32, 33 of functional regions 1. A first functional region 1 acts as a connection region 32 for crimping connections which are still intended to be provided in additional processing steps. The contact element 30 is a contact spring for a socket contact.

The connection region 32 is coated with an extensive, homogeneous material coating 4 which preferably contains tin or comprises tin.

The additional functional regions 1 are contact locations 33 which are constructed from at least two material coatings 4a, 4b.

Figure 20:
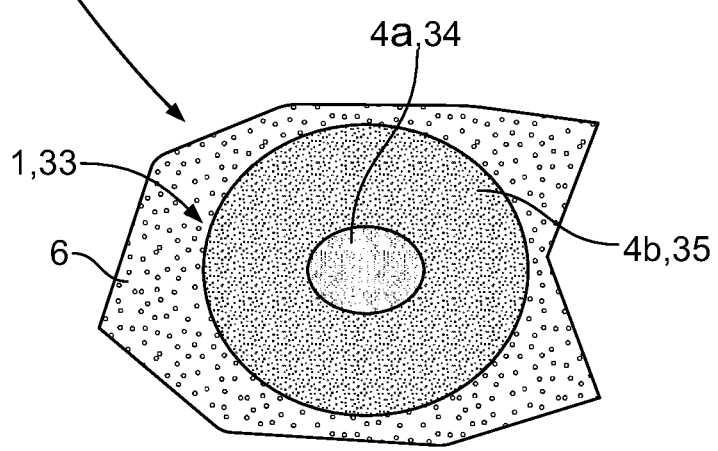
FIG. 20 shows a detail XX of FIG. 19.

FIG. 20 which illustrates the detail XX of FIG. 19 to an enlarged scale clearly shows the construction of a contact location 33. The material coating 4a forms a contact point 34 of the contact location 33. At the contact point 34, a counter-contact contacts the contact element 30 in the assembled contact element 30. In the illustrated contact element 30 for a socket contact, the contact movement is carried out perpendicularly relative to the plane of the contact element 30 in a direction towards the contact location 33 so that the contact point 34 should have a high level of impact and wear resistance in order to withstand a large number of insertion cycles without suffering any damage.

The material coating 4b surrounds the material coating 4a and forms a contact surrounding region 35. The material coating 4a can be fitted beside or on the material coating 4b, as illustrated, for example, in FIGS. 2, 3, 12.

The contact surrounding region is intended to prevent corrosion of the base material 6 around and/or under the contact point 34 or corrosion of the contact point 34. The material coating 4b can therefore be doped with a metal which is of a lower grade in comparison with the base material 6 and the main component of the contact location 33, in particular a thin coating thickness can be selected therefor because no removal of material during use as in the introduction region is to be anticipated in that region.

The functional region at the contact location 33 can be constructed from one or more material coatings which comprise a hardenable material. In the region of the contact point 34, at least one coating can be hardened and adjoin a non-hardened coating or a coating having lesser hardness and greater ductility, as shown, for example, in FIG. 7. In the contact surrounding region 35, the material coating 4 can be processed with different radiation parameters, as illustrated in FIGS. 2 and 7, and consequently have different physical properties from those in the contact point 34. It is thereby possible to achieve a high level of impact resistance with a high level of wear resistance at the same time.

The material coatings 4a, 4b preferably comprise different materials. The material coating 4a which forms the contact point 34 has an electrical resistance which is reduced in relation to the contact surrounding region 35 and increased impact resistance.

Figure 21:
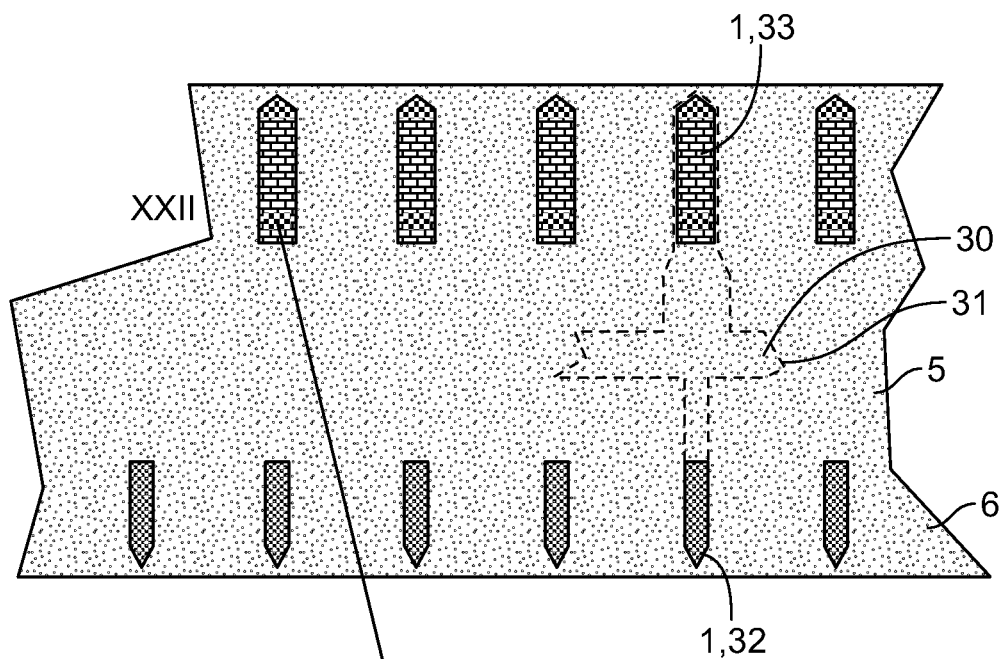
FIG. 21 is a schematic illustration of a second embodiment of a contact element according to the invention during its production.

FIG. 21 shows a band-like material 5, from which contact elements 30 for a plug type connector are cut by means of the highly energetic radiation 9 (not shown). The line 31 schematically shows the outer contour of the contact elements which are bent into their definitive shape in a subsequent processing step.

In the contact element illustrated in FIG. 21, two different types 32, 33 of functional regions 1 are again illustrated merely by way of example. One functional region 1 acts as a connection region 32 for soldering on electrical conductors. It substantially corresponds to the structure of the connection region 32 of FIG. 19 except for its outer contour. The other functional region 1 acts as a contact location 33 in which, however, the construction and the arrangement of the material coatings 4 have been optimised with regard to the different mechanical loads during operation.

Figure 22:
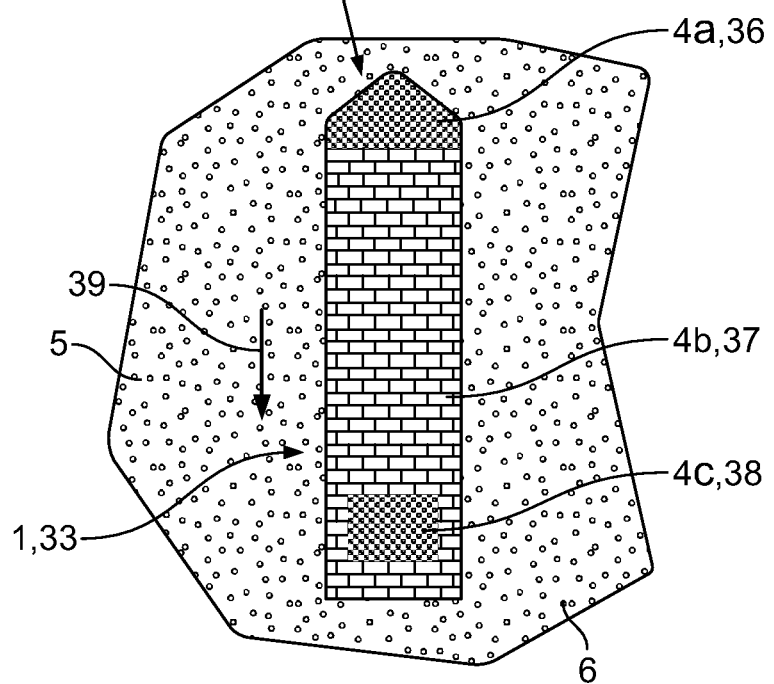
FIG. 22 shows a detail XXII of FIG. 21.

FIG. 22 shows, as detail XXII, a contact location 33 of the contact element 30.

The functional region 1 which forms the connection region accordingly has three material coatings 4a, 4b, 4c. The material coatings 4a, 4b, 4c are preferably located beside each other. The material coatings 4a, 4b are produced from the same material, for example, in accordance with the method according to FIG. 6. The material coating 4c is surrounded by the material coating 4b and has a composition which is different from that of the material coating 4c.

The material coating 4a forms an introduction region 36 of the contact location 33, in which a counter-contact strikes the contact element 30 when a plug type connection is produced. In that region, it is advantageous for the material coating to have increased wear resistance and impact resistance, similarly to the contact point 34 of FIGS. 19 and 20. This can be achieved, for example, in that the material coating 4a was produced in accordance with the method according to FIG. 13 and has, for example, a hardened coating on a softer coating. In particular that introduction region may also comprise electrically insulating materials if a flow of current is not desirable or necessary in that introduction region 36.

During operation of the contact element 30, the mating connector is guided during the insertion movement via an introduction region 36 in an insertion direction 39 over the connection region. The material coating 4b in the introduction region 36 is tribologically optimised. It can have, for example, surface structures 22 which extend in an insertion direction 39 and which guide the mating connector. Additionally or alternatively, it can be doped with materials which bring about lubrication. For example, microparticles having good lubricating properties, such as graphite, can be embedded in the material coating 4b or can be sprayed on in a matrix.

The contact location 38, which is constructed in accordance with the contact point 34 of FIG. 20 from one or more material coatings having low conduction and transition resistances, adjoins the contact insertion region 37 in the insertion direction 39.

Furthermore, the contact location 38 can be provided with a surface structure which results in increased friction so that the counter-contact is held more securely and any oxide coatings are removed by slight surface removal.

If materials which can react with the base material 6 are contained in one of the material coatings 4a, 4b, 4c of the contact location 33, an intermediate coating which electrically insulates the materials of the introduction region 36 of the contact insertion region 37 and the contact location 38 from the base material can be provided.

The highly energetic radiation 9 can be used for quality control in that, for example, a scanning electron microscope imaging method for geometry and material contrast is used to control the functional regions produced.

The method according to the invention in its variants which are illustrated above and which can be combined with each other freely, even in part, is very environmentally sustainable in contrast to wet-chemical methods. Owing to the exact positionability and dimensionability of the material coatings, only as much material is consumed as is actually necessary to produce the functional region.

The method allows use of contact materials and contact material combinations which are not conventionally able to be produced and which improve the product properties with reduced use of materials. It is further possible to produce amorphous microstructures and nanostructures and frozen mixing phases of non-alloyable materials and to constitute different material functions directly beside each other, such as, for example, good electrical contacting, ease of soldering, corrosion protection and wear protection.

The material coatings can be structured, contoured and influenced in terms of their mechanical properties, including only over subareas.

Finally, high production speeds are possible and the highly energetic radiation can simultaneously be used for other processing steps and quality control.

REFERENCE NUMERALS

| 1 | Functional region |
|---|---|
| 2 | Contact element |
| 3 | Surface |
| 4 | Material coating |
| 4a-4c | Different material coatings |
| 4' | Wire |
| 4" | Film |
| 5 | Band-like material |
| 6 | Base material |
| 7 | Band advance |
| 8 | Production station |
| 8' | Radiation source |
| 9 | Highly energetic thermal radiation |
| 10 | Device for bundling the highly |
| 11 | Boundary face |
| 12 | Active region |
| 13 | Beam cross-section |
| 14 | Active depth |
| 15 | Thermal beam |
| 16 | Spacing of the material coatings |
| 17 | Mask |
| 17' | Diffraction grating/grid |
| 18 | Gap |
| 19 | Shoulder |
| 20 | Alloyed region/frozen grain structure |
| 21a-21c | Subarea of a material coating |
| 22 | Surface structure |
| 23 | Movement grid |
| 24 | Molten regions |
| 25 | Arrow |
| 26 | Thickness of the material coating |
| 27 | Beam splitter |
| 28 | Spraying tool |
| 29 | Spraying beam |
| 30 | Contact elements |
| 31 | Line |
| 32 | Connection region |
| 33 | Contact location |
| 34 | Contact point |
| 35 | Contact surrounding region |
| 36 | Introduction region |
| 37 | Contact insertion region |
| 38 | Contact location |
| 39 | Insertion direction |

What is claimed is:

1. A method for producing at least one functional region on an electrical contact element, the at least one functional region being limited to a partial area of the electrical contact element, the method comprising:
providing the electrical contact element comprising a base material;
providing the at least one functional region comprising at least a first functional region, a second functional region, and a third functional region;
mechanically applying at least one material coating comprising a first material coating, a second material coating, a third material coating, and a fourth material coating to the electrical contact element in the at least one functional region;
directing, subsequent to the mechanically applying step, a highly energetic thermal radiation onto the at least one material coating;
producing portions having different mechanical properties in the at least one functional region within a material coating of the same material,
wherein the producing step includes changing the radiation parameters of the highly energetic thermal radiation embedding a lower part of the first material coating within the base material in the first functional region by a distance corresponding to a first active depth beneath an outer surface of the base material subsequent to the directing step;
extending an upper part of the first material coating above the outer surface of the base material the directing step;
embedding a lower part of the second material coating within the base material in the second functional region by a distance corresponding to a second active depth beneath the outer surface of the base material subsequent to the directing step;
extending an upper part of the second material coating above the outer surface of the base material subsequent to the directing step;
embedding a lower part of the third material coating within the base material in the third functional region by a distance corresponding to a third active depth beneath the outer surface of the base material subsequent to the directing step;
extending an upper part of the third material coating above the outer surface of the base material subsequent to the directing step;
embedding the fourth material coating in contact with the first, second, and third material coatings;
arranging the first material coating side-by-side with the fourth material coating;
contacting, directly, the first material coating with the fourth material coating;
contacting, directly, the fourth material coating with the base material;
and
wherein the first active depth is different from the second and third active depths.

2. The method according to claim 1, wherein at least one of a density, a thermal conductivity, and a melting point of the first material coating is different from that of the second, third, and fourth material coatings.

3. The method according to claim 1, wherein at least one of a density, a thermal conductivity, and a melting point of the first material coating is different from that of the fourth material coating.

4. The method according to claim 3, wherein the first material coating is in a vertically-stacked arrangement with the fourth material coating, and the first material coating is positioned vertically intermediate the fourth material coating and the base material.

5. The method according to claim 4, wherein the fourth material coating vertically and laterally surrounds the first material coating and is in direct contact with the first material coating and the base material.

6. A method for producing at least one functional region on an electrical contact element, the at least one functional region being limited to a partial area of the electrical contact element, the method comprising:
providing the electrical contact element comprising a base material;
providing the at least one functional region comprising at least a first functional region, a second functional region, and a third functional region;

mechanically applying at least one material coating to the electrical contact element in the at least one functional region;

directing, subsequent to the mechanically applying step, a highly energetic thermal radiation onto the at least one material coating;

producing portions having different mechanical properties in the at least one functional region within a material coating of the same material, wherein the producing step includes:

changing by the radiation parameters of the highly energetic radiation embedding a lower part of the first material coating within the base material in the first functional region by a distance corresponding to a first active depth beneath an outer surface of the base material subsequent to the directing step;

extending an upper part of the first material coating above the outer surface of the base material the directing step;

embedding a lower part of the second material coating within the base material in the second functional region by a distance corresponding to a second active depth beneath the outer surface of the base material subsequent to the directing step;

extending an upper part of the second material coating above the outer surface of the base material subsequent to the directing step;

embedding a lower part of the third material coating within the base material in the third functional region by a distance corresponding to a third active depth beneath the outer surface of the base material subsequent to the directing step;

extending an upper part of the third material coating above the outer surface of the base material subsequent to the directing step;

embedding the fourth material coating in contact with the first, second, and third material coatings;

contacting, directly, the first material coating and the base material with the fourth material coating;

contacting the fourth material coating with the second and third material coatings, and the first active depth is different from the second and third active depths;

stacking, vertically, the first material coating with the fourth material coating;

positioning the first material coating vertically intermediate the fourth material coating; and surrounding, vertically and laterally, the first material coating with the fourth material coating.

\* \* \* \* \*